(12) United States Patent
Tsuzaki

(10) Patent No.: US 8,193,861 B2
(45) Date of Patent: Jun. 5, 2012

(54) DIFFERENTIAL AMPLIFIER

(75) Inventor: Toshiyuki Tsuzaki, Chiba (JP)

(73) Assignee: Seiko Instruments Inc., Chiba (JP)

( * ) Notice: Subject to any disclaimer, the term of this patent is extended or adjusted under 35 U.S.C. 154(b) by 26 days.

(21) Appl. No.: 12/888,884

(22) Filed: Sep. 23, 2010

(65) Prior Publication Data

US 2011/0074507 A1 Mar. 31, 2011

(30) Foreign Application Priority Data

Sep. 29, 2009 (JP) ................... 2009-225464

(51) Int. Cl.
*H03F 3/45* (2006.01)

(52) U.S. Cl. ...................... 330/253; 330/255

(58) Field of Classification Search .......... 330/253, 330/255, 257, 261
See application file for complete search history.

(56) References Cited

U.S. PATENT DOCUMENTS

| 5,311,145 A * | 5/1994 | Huijsing et al. | 330/255 |
| 7,116,171 B2 * | 10/2006 | Maekawa et al. | 330/253 |
| 7,253,685 B2 * | 8/2007 | Chung | 330/255 |
| 7,330,074 B2 * | 2/2008 | Kang et al. | 330/255 |

OTHER PUBLICATIONS

Razavi, Behzad, "Design of analog CMOS integrated circuit," McGraw Hill Higher Education, International Edition, Second Volume, 2001, 4 pages (with translation).

* cited by examiner

*Primary Examiner* — Khanh V Nguyen
(74) *Attorney, Agent, or Firm* — Brinks Hofer Gilson & Lione

(57) ABSTRACT

A Provided is a differential amplifier in which a current flowing into an output transistor may be adjusted to a constant value even when a voltage of a non-inverting input terminal changes. A current flowing through the differential amplifier circuit is controlled by a current source, a current value of which is changed depending on the voltage of the non-inverting input terminal.

4 Claims, 5 Drawing Sheets

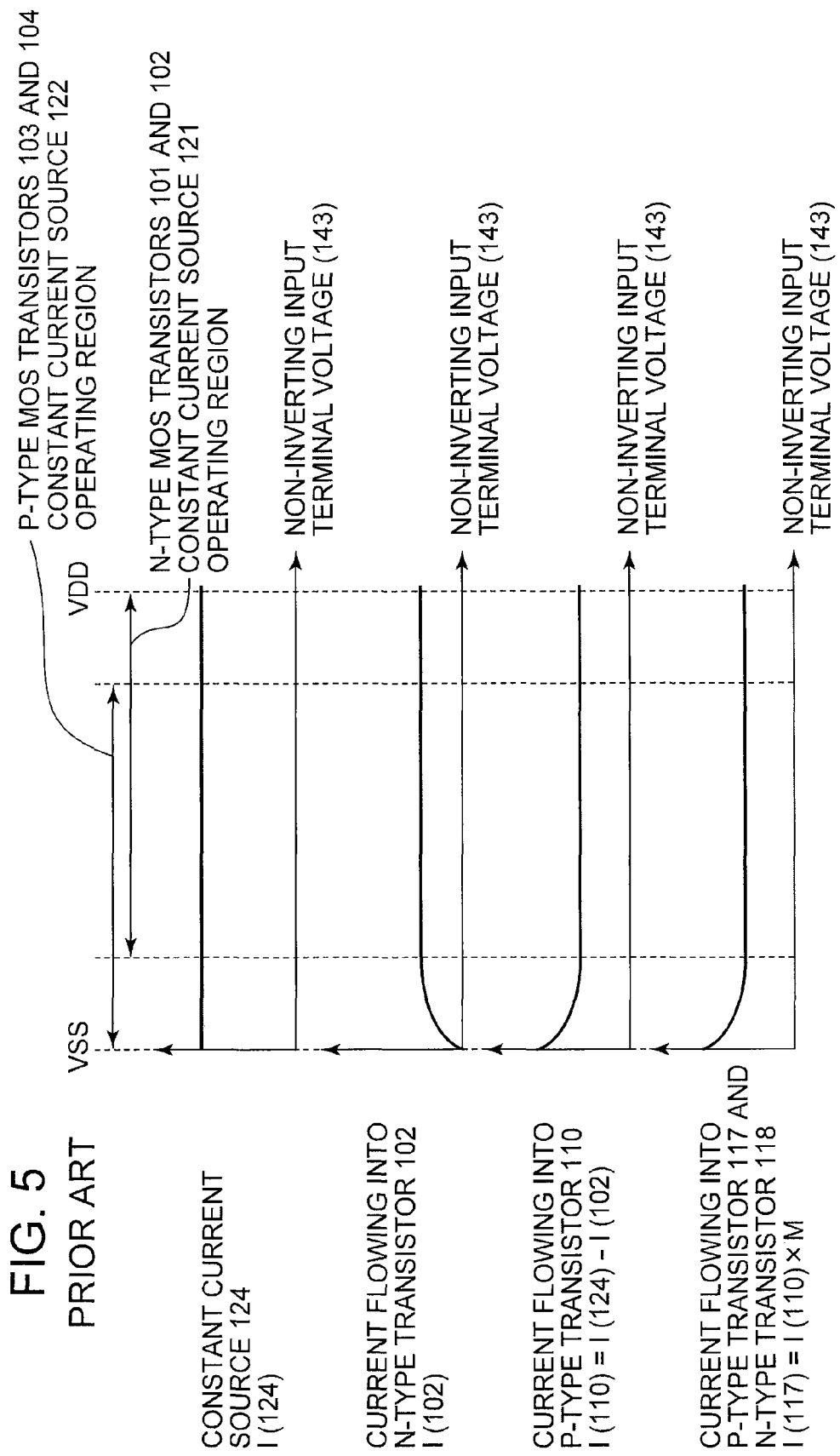

US 8,193,861 B2

DIFFERENTIAL AMPLIFIER

RELATED APPLICATIONS

This application claims priority under 35 U.S.C. §119 to Japanese Patent Application No. 2009-225464 filed on Sep. 29, 2009, the entire content of which is hereby incorporated by reference.

BACKGROUND OF THE INVENTION

1. Field of the Invention

The present invention relates to a differential amplifier including a CMOS circuit.

2. Description of the Related Art

In order to widen an input voltage range of a differential amplifier, a technology of providing a differential input circuit including an N-type MOS transistor and a differential input circuit including a P-type MOS transistor has been known.

FIG. 4 illustrates a conventional input rail-to-rail differential amplifier.

The conventional input rail-to-rail differential amplifier includes: a non-inverting input terminal 143; an inverting input terminal 144; a differential amplifier circuit including P-type MOS transistors 107 and 108, N-type MOS transistors 101 and 102, and a constant current source 121; a differential amplifier circuit including P-type MOS transistors 103 and 104, N-type MOS transistors 113 and 114, and a constant current source 122; a constant current source 124 for causing currents to flow into the P-type MOS transistors 107 and 108; and an output circuit provided between the differential amplifier circuits and an output terminal 145. The output circuit includes: an output driver including a P-type MOS transistor 117 and an N-type MOS transistor 118; and phase compensation capacitors 151 and 152.

When a voltage close to a power supply voltage is input to the non-inverting input terminal 143 and the inverting input terminal 144, the P-type MOS transistors 103 and 104 are turned off, but a differential input circuit including the N-type MOS transistors 101 and 102 operates. When a voltage close to a ground (GND) voltage is input to the non-inverting input terminal 143 and the inverting input terminal 144, the N-type MOS transistors 101 and 102 are turned off, but a differential input circuit including the P-type MOS transistors 103 and 104 operates. Therefore, an input rail-to-rail operation is realized. Cascode voltages are applied to terminals 131, 132, 133, and 134.

Gate voltages of the P-type MOS transistor 117 and the N-type MOS transistor 118 of the output driver connected to the output terminal 145 are controlled to suitable voltages by a P-type MOS transistor 115 and an N-type MOS transistor 116. In a case where a current flows through a P-type MOS transistor 110 and an N-type MOS transistor 112, even when there is no load current in the output terminal 145, a current flows into the transistors of the output driver, to thereby implement a class-AB output operation (see, for example, "Design of analog CMOS integrated circuit", Second volume, p. 396).

As described above, even in a case where the voltage of the non-inverting input terminal 143 is changed between the GND voltage and the power supply voltage, any one of the differential input circuit including the P-type MOS transistors and the differential input circuit including the N-type MOS transistors operates, and hence the input rail-to-rail operation is possible.

However, the differential amplifier described above has a problem that a value of the current flowing through the transistors of the output driver changes depending on a voltage level input to the non-inverting input terminal 143 and the inverting input terminal 144.

FIG. 5 illustrates current values at respective nodes in a case where the voltage of the non-inverting input terminal 143 is changed in the differential amplifier illustrated in FIG. 4.

In order to implement the class-AB output operation, a current is required to flow through the P-type MOS transistor 117 and the N-type MOS transistor 118 even in a case where the load current does not flow into the output terminal 145.

The P-type MOS transistor 115 is provided to adjust a gate-source voltage of the P-type MOS transistor 117 so that a current continuously flows into the P-type MOS transistor 117. Therefore, a current value of the P-type MOS transistor 117 is determined based on a threshold value of the P-type MOS transistor 115 and a flowing current value. The N-type MOS transistor 116 is provided to adjust a gate-source voltage of the N-type MOS transistor 118 so that a current continuously flows into the N-type MOS transistor 118. Therefore, a current value of the N-type MOS transistor 118 is determined based on a threshold value of the N-type MOS transistor 116 and a flowing current value. A current flowing through the P-type MOS transistor 110 is divided into two by the P-type MOS transistor 115 and the N-type MOS transistor 116. A current flowing into the P-type MOS transistor 110 is obtained by subtracting a current value of the N-type MOS transistor 102 from a current value of the P-type MOS transistor 108 connected to the constant current source 124 for current mirror.

As described above, the current value of the N-type MOS transistor 102 reduces when the voltage of the non-inverting input terminal 143 is close to the power supply voltage. Therefore, the current flowing into the P-type MOS transistor 110 increases, to thereby significantly change the value of the current flowing through the P-type MOS transistor 117 and the N-type MOS transistor 118. Thus, a value of an output capacitor which may be connected to the output terminal 145 to be drivable changes, and hence phase compensation is difficult. That is, the phase compensation capacitors 151 and 152 are required to have a large capacitance with a margin.

SUMMARY OF THE INVENTION

The present invention has been made to solve the problem as described above. An object of the present invention is to provide a differential amplifier in which an output current does not change depending on an input voltage.

In the present invention, a constant current value is changed based on a voltage of a non-inverting input terminal of the differential amplifier, to thereby solve the problem as described above.

According to the present invention, even when the voltage of the non-inverting input terminal changes, a current flowing into a transistor of an output driver may be adjusted to a constant value.

BRIEF DESCRIPTION OF THE DRAWINGS

In the accompanying drawings:

FIG. 5 is a diagram illustrating input voltage-current characteristics of the conventional differential amplifier.

DETAILED DESCRIPTION OF THE PREFERRED EMBODIMENTS

Hereinafter, a differential amplifier according to the present invention is described with reference to the attached drawings.

Figure 1:
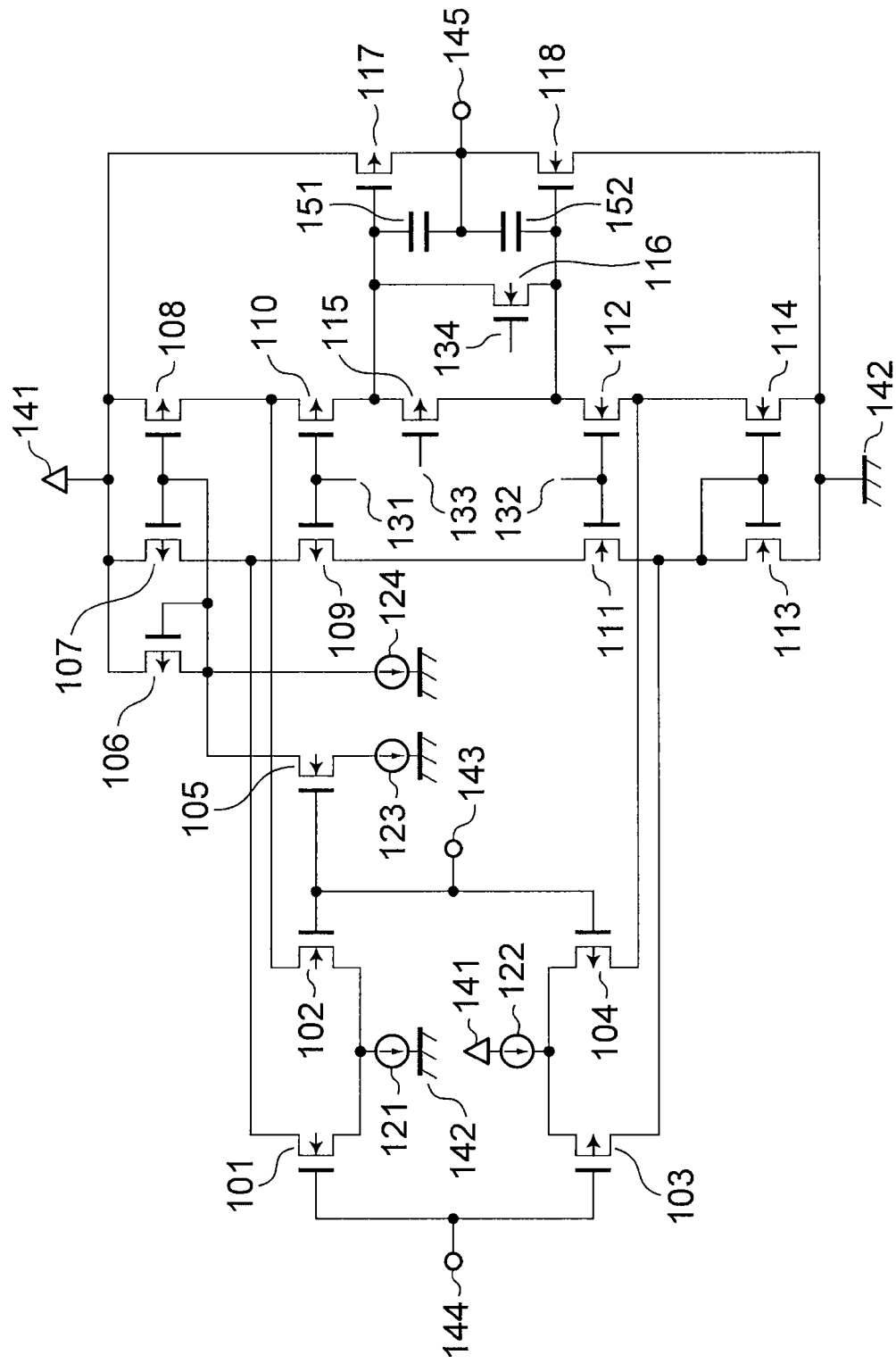
FIG. 1 is a circuit diagram illustrating a differential amplifier according to the present invention.

FIG. 1 is a circuit diagram illustrating a differential amplifier according to the present invention.

The differential amplifier according to the present invention includes: a non-inverting input terminal 143; a inverting input terminal 144; a differential amplifier circuit including P-type MOS transistors 107 and 108, N-type MOS transistors 101 and 102, and a constant current source 121; a differential amplifier circuit including P-type MOS transistors 103 and 104, N-type MOS transistors 113 and 114, and a constant current source 122; a constant current source 124 for causing currents to flow into the P-type MOS transistors 107 and 108; and an output circuit provided between the differential amplifier circuits and an output terminal 145.

The N-type MOS transistors 101 and 102 serve as a differential input circuit of N-type MOS transistors. The P-type MOS transistors 103 and 104 serve as a differential input circuit of P-type MOS transistors. In the differential input circuit of N-type MOS transistors, the P-type MOS transistors 107 and 108 serve as a current source and the N-type MOS transistors 113 and 114 serves as a current mirror.

The output circuit includes: an output driver including a P-type MOS transistor 117 and an N-type MOS transistor 118; and phase compensation capacitors 151 and 152. The differential amplifier according to the present invention further includes a constant current source 123 and an N-type MOS transistor 105, which serves as a current control circuit for causing currents to flow into the P-type MOS transistors 107 and 108.

When a voltage close to a power supply voltage is input to the non-inverting input terminal 143 and the inverting input terminal 144, the P-type MOS transistors 103 and 104 are turned off, but the differential input circuit including the N-type MOS transistors 101 and 102 operates. When a voltage close to a ground (GND) voltage is input to the non-inverting input terminal 143 and the inverting input terminal 144, the N-type MOS transistors 101 and 102 are turned off, but the differential input circuit including the P-type MOS transistors 103 and 104 operates. Cascode voltages are applied to terminals 131, 132, 133, and 134.

Gate voltages of the P-type MOS transistor 117 and the N-type MOS transistor 118 of the output driver connected to the output terminal 145 are controlled to suitable voltages by a P-type MOS transistor 115 and an N-type MOS transistor 116. In a case where a current flows through a P-type MOS transistor 110 and an N-type MOS transistor 112, even when there is no load current in the output terminal 145, a current flows into the transistors of the output driver, to thereby implement a class-AB output operation.

From FIG. 1, a current I(110) flowing through the P-type MOS transistor 110 is expressed by Expression (1).

$$I(110)=I(124)+I(123)-I(102) \quad (1)$$

where I(124) indicates a current of the constant current source 124, I(123) indicates a current of the constant current source 123, and I(102) indicates a current of the N-type MOS transistor 102. A gate of the N-type MOS transistor 105 is connected to the non-inverting input terminal 143. Therefore, when the voltage close to the power supply voltage is input to the non-inverting input terminal 143, the current I(123) reduces in synchronization with the current I(102). Thus, the current I(110) flowing through the P-type MOS transistor 110 may be adjusted to a constant value.

Figure 2:
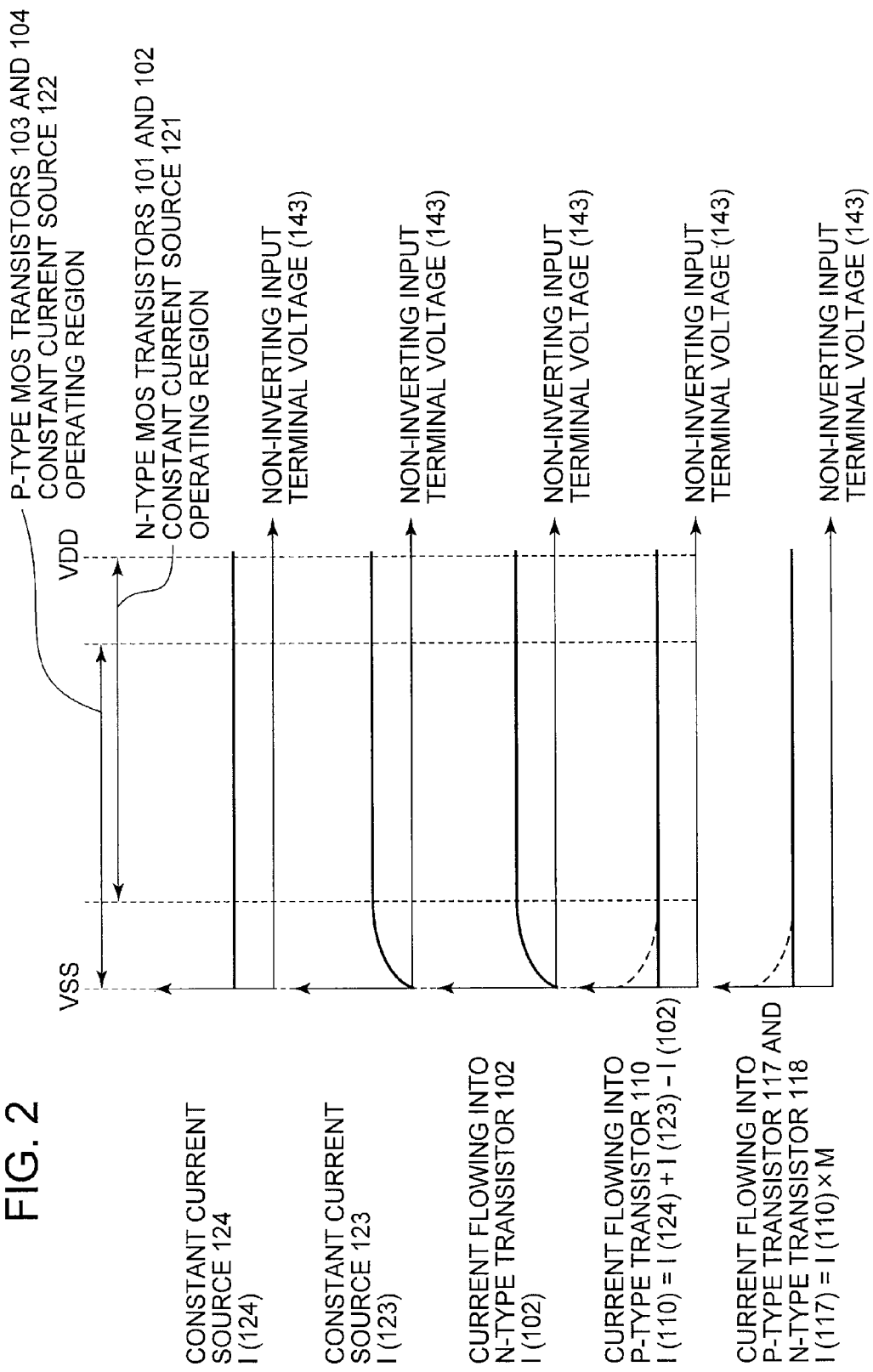
FIG. 2 is a diagram illustrating input voltage-current characteristics of the differential amplifier illustrated in FIG. 1.

FIG. 2 illustrates current values at respective nodes in a case where the voltage of the non-inverting input terminal 143 is changed in the differential amplifier illustrated in FIG. 1.

As can be seen in FIG. 2, the current flowing through the P-type MOS transistor 117 and the N-type MOS transistor 118 may be maintained to a constant value. Thus, the phase compensation capacitors 151 and 152 may be reduced in capacitance.

Figure 3:
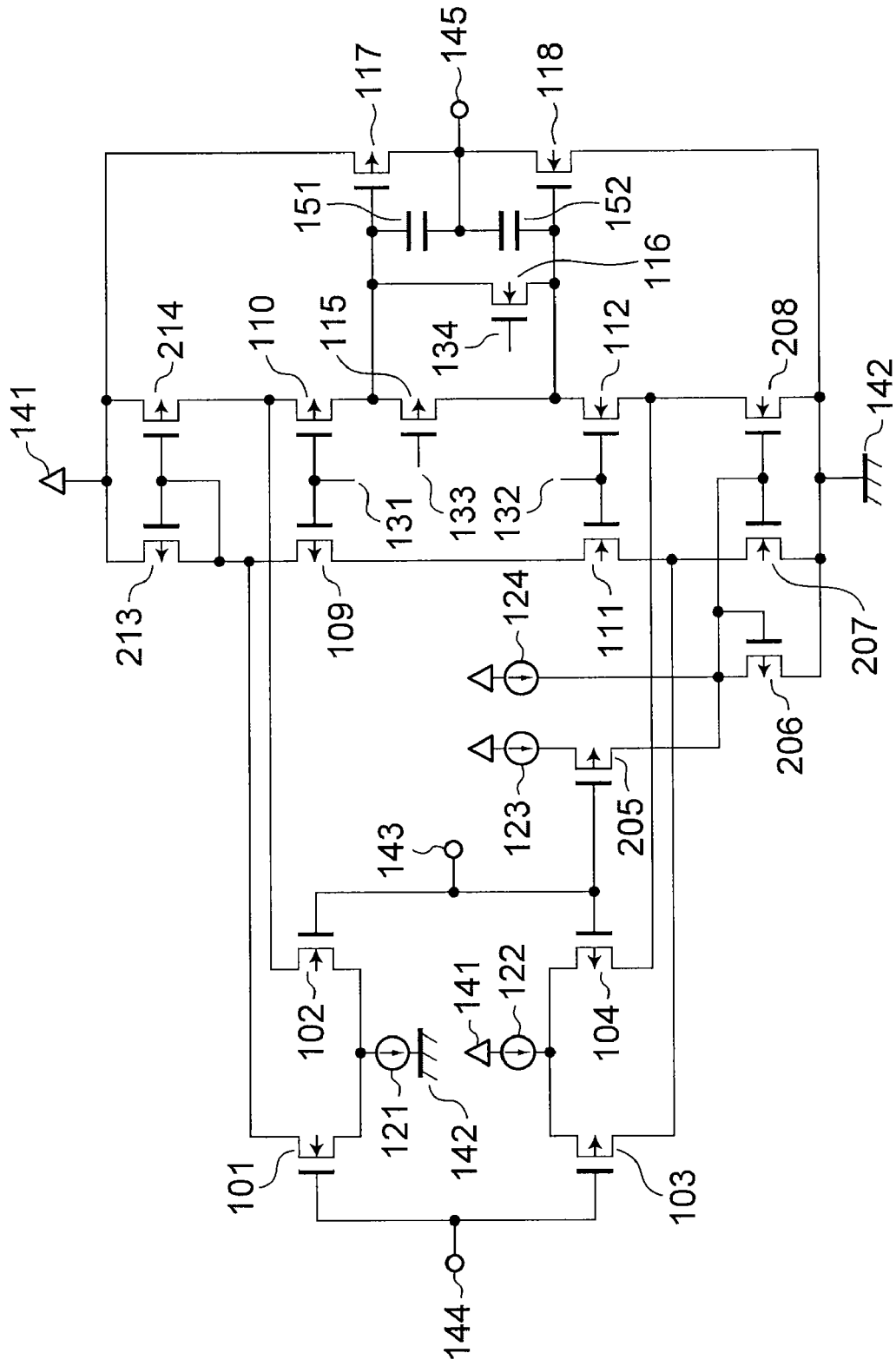
FIG. 3 is a circuit diagram illustrating another example of the differential amplifier according to the present invention.
Figure 4:
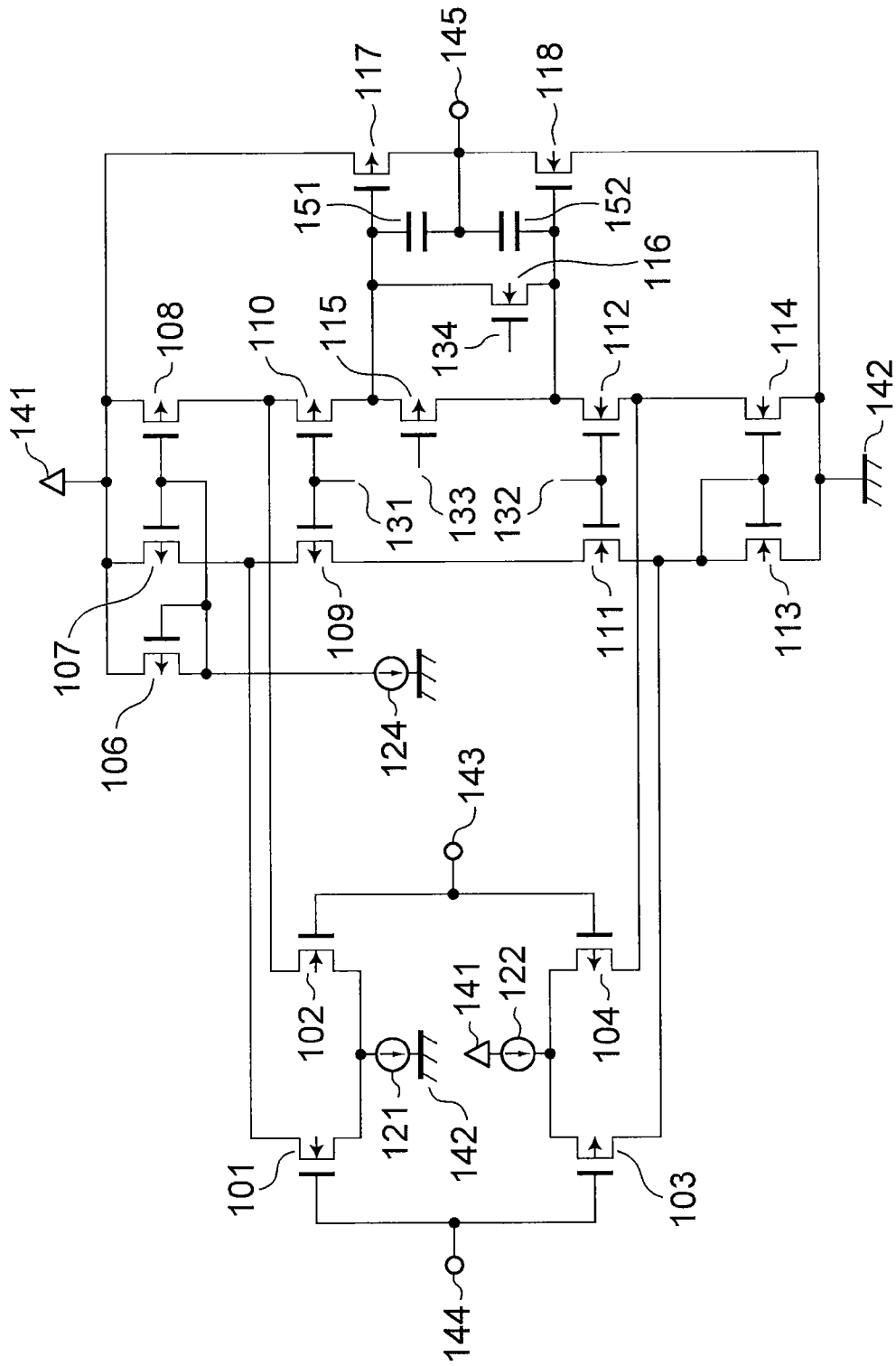
FIG. 4 is a circuit diagram illustrating a conventional differential amplifier.

FIG. 3 is a circuit diagram illustrating another example of the differential amplifier according to the present invention. In the differential amplifier illustrated in FIG. 1, the P-type MOS transistors 107 and 108 serve as the current source and the N-type MOS transistors 113 and 114 serve as the current mirror. In contrast to this, the differential amplifier illustrated in FIG. 3 has a reverse structure. That is, P-type MOS transistors 213 and 214 serve as a current mirror and the N-type MOS transistors 207 and 208 serve as a current source. Further, a constant current source 123 and a P-type MOS transistor 205 are provided as a current control circuit. A gate of the P-type MOS transistor 205 is connected to the non-inverting input terminal 143.

As in the case of the differential amplifier illustrated in FIG. 1, according to the differential amplifier having the structure as described above, the current flowing through the P-type MOS transistor 117 and the N-type MOS transistor 118 may be maintained to a constant value. Thus, the phase compensation capacitors 151 and 152 may be reduced in capacitance.

What is claimed is:

1. A differential amplifier, comprising:
   a non-inverting input terminal;
   an inverting input terminal;
   an output terminal;
   a first differential amplifier circuit including a differential input circuit including N-type MOS transistors connected to the non-inverting input terminal and the inverting input terminal;
   a second differential amplifier circuit including a differential input circuit including P-type MOS transistors connected to the non-inverting input terminal and the inverting input terminal; and
   an output circuit which is connected to the first differential amplifier circuit and the second differential amplifier circuit and includes an output transistor,
   wherein the P-type MOS transistors of the second differential amplifier serve as a current source of the first differential amplifier circuit and comprise a current control circuit in which a constant current value is changed by a voltage of the non-inverting input terminal, and, when the voltage of the non-inverting input terminal changes, a current flowing into the output transistor is maintained to a constant value.

2. A differential amplifier according to claim 1, wherein:
   the current control circuit comprises:
      a constant current source; and
      an N-type MOS transistor which includes a gate connected to the non-inverting input terminal, a source connected to the constant current source, and a drain connected to the P-type MOS transistors serving as the current source of the first differential amplifier circuit.

3. A differential amplifier, comprising:
a non-inverting input terminal;
an inverting input terminal;
an output terminal;
a first differential amplifier circuit including a differential input circuit including N-type MOS transistors connected to the non-inverting input terminal and the inverting input terminal;
a second differential amplifier circuit including a differential input circuit including P-type MOS transistors connected to the non-inverting input terminal and the inverting input terminal; and
an output circuit which is connected to the first differential amplifier circuit and the second differential amplifier circuit and includes an output transistor,
wherein the N-type MOS transistors of the first differential amplifier circuit serve as a current source of the second differential amplifier circuit and comprise a current control circuit in which a constant current value is changed by a voltage of the non-inverting input terminal, and, when the voltage of the non-inverting input terminal changes, a current flowing into the output transistor is maintained to a constant value.

4. A differential amplifier according to claim 3, wherein:
the current control circuit comprises:
a constant current source; and
a P-type MOS transistor which includes a gate connected to the non-inverting input terminal, a source connected to the constant current source, and a drain connected to the N-type MOS transistors serving as the current source of the second differential amplifier circuit.

* * * * *